(12) United States Patent
Wang et al.

(10) Patent No.: US 6,365,505 B1
(45) Date of Patent: Apr. 2, 2002

(54) METHOD OF MAKING A SLOT VIA FILLED DUAL DAMASCENE STRUCTURE WITH MIDDLE STOP LAYER

(75) Inventors: Fei Wang, San Jose; Lynne A. Okada, Sunnyvale; Ramkumar Subramanian, San Jose; Calvin T. Gabriel, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/780,531

(22) Filed: Feb. 21, 2001

(51) Int. Cl.$^7$ .......................................... H01L 21/4763
(52) U.S. Cl. ...................... 438/624; 438/634; 438/637; 438/638; 438/666; 438/668; 438/672; 438/687
(58) Field of Search ................... 438/624, 634, 438/637, 638, 666, 668, 672, 687

(56) References Cited

U.S. PATENT DOCUMENTS

| | | | | |
|---|---|---|---|---|
| 5,920,790 A | * | 7/1999 | Wetzel et al. ............... | 438/624 |
| 6,127,258 A | * | 10/2000 | Watanabe et al. ........... | 438/637 |
| 6,165,898 A | * | 12/2000 | Jang et al. .................. | 438/638 |
| 6,245,662 B1 | * | 6/2001 | Naik et al. .................. | 438/637 |
| 6,309,955 B1 | * | 10/2001 | Subramanian et al. ...... | 438/624 |
| 6,309,962 B1 | * | 10/2001 | Chen et al. ................. | 438/638 |
| 6,319,809 B1 | * | 11/2001 | Chang et al. ............... | 438/687 |

* cited by examiner

Primary Examiner—John F. Niebling
Assistant Examiner—Lynne Gurley

(57) ABSTRACT

A method of forming an interconnect structure in which an inorganic low k dielectric material is deposited over a conductive layer to form a first dielectric layer. An etch stop layer is formed on the first dielectric layer. The etch stop layer and the first dielectric layer are etched to form a slot via in the first dielectric layer. The slot via is longer than the width of a subsequently formed trench. An organic low k dielectric material is deposited within the slot via and over the etch stop layer to form a second dielectric layer over the slot via and the etch stop layer. The re-filled slot via is simultaneously etched with the second dielectric layer in which a trench is formed. The entire width of the trench is directly over the via. The re-opened via and the trench are filled with a conductive material.

15 Claims, 7 Drawing Sheets

METHOD OF MAKING A SLOT VIA FILLED DUAL DAMASCENE STRUCTURE WITH MIDDLE STOP LAYER

RELATED APPLICATIONS

The present application contains subject matter related to subject matter disclosed in co-pending U.S. patent application Ser. No. 09/788,474, filed on Feb. 21, 2001, Ser. No. 09/778,070, filed on Feb. 2, 2001, and Ser. No. 09/788,641, filed on Feb. 21, 2001.

FIELD OF THE INVENTION

The present invention relates to the formation of metal interconnection layers during the manufacture of semiconductor devices, and more particularly to the formation of a damascene structure in a metal interconnect region by a via fill dual damascene technique.

BACKGROUND OF THE INVENTION

The escalating requirements for high-density and performance associated with ultra large-scale integration semiconductor wiring require responsive changes in interconnection technology. Such escalating requirements have been found difficult to satisfy in terms of providing a low RC (resistance capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns comprising conductive lines separated by inter-wiring spacings. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor chips comprising five or more levels of metalization are becoming more prevalent as device geometries shrink to sub-micron levels.

A conductive plug filling a via hole is typically formed by depositing a dielectric interlayer on a conductive layer comprising at least one conductive pattern, forming an opening in the dielectric layer by conventional photolithographic and etching techniques, and filling the opening with a conductive material, such as tungsten (W). Excess conductive material on the surface of the dielectric layer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with a conductive material, typically a metal, to simultaneously form a conductive plug and electrical contact with a conductive line.

High-performance microprocessor applications require rapid speed of semiconductor circuitry. The control speed of semiconductor circuitry varies inversely with the resistance and capacitance of the interconnect pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Thus, the interconnection pattern limits the speed of the integrated circuit. If the interconnection node is routed over a considerable distance, e.g., hundreds of microns or more as in sub-micron technologies, the interconnection capacitance limits the circuit node capacitance loading, and hence, the circuit speed. As integration density increases and feature size decreases in accordance with sub-micron design rules, e.g., a design rule of about 0.1 micron and below, the rejection rate due to integrated circuit speed delays severely limits production throughput and significantly increases manufacturing costs.

In prior technologies, aluminum was used in very large scale integration interconnect metalization. Copper and copper alloys have received considerable attention as a candidate for replacing aluminum in these metalizations. Copper has a lower resistivity than aluminum and improved electrical properties compared to tungsten, making copper a desirable metal for use as a conductive plug as well as conductive wiring.

In the formation of a dual damascene structure in a self-aligned manner, a conductive line and vias that connect the line to conductive elements in a previously formed underlying conductive layer, are simultaneously deposited. A conductive material is deposited into openings (e.g., the via holes and trenches) created in dielectric material that overlays the conductive interconnect layer. Typically, a first layer of dielectric material is deposited over a bottom etch stop layer that covers and protects the conductive interconnect layer. A middle etch stop layer is then deposited over the first dielectric layer. A pattern is then etched into the middle etch stop layer to define the feature, such as a via hole, that will later be etched into the first dielectric layer. Once the middle etch stop layer is patterned, a second dielectric layer is deposited on the middle etch stop layer. The hard mask layer may then be deposited on the second dielectric layer. A desired feature, such as a trench, is etched through the hard mask layer and the second dielectric layer. This etching continues so that the first dielectric layer is etched in the same step as the second dielectric layer. The etching of the two dielectric layers in a single etching step reduces the number of manufacturing steps. The bottom etch stop layer within the via hole, which has protected the conductive material in the conductive interconnect layer, is then removed with a different etchant chemistry. With the via holes now formed in the first dielectric layer and a trench formed in the second dielectric layer, conductive material is simultaneously deposited in the via and the trench in a single deposition step. (If copper is used as the conductive material, a barrier layer is conventionally deposited first to prevent copper diffusion.) The conductive material makes electrically conductive contact with the conductive material in the underlying conductive interconnect layer.

In efforts to improve the operating performance of a chip, low k dielectric materials have been increasingly investigated for use as replacements for dielectric materials with higher k values. Lowering the overall k values of the dielectric layers employed in the metal interconnect layers lowers the RC of the chip and improves its performance. However, low k materials, such as benzocyclobutene (BCB), hydrogen silsesquioxane (HSQ), SiOF, etc., are often more difficult to handle than traditionally employed higher k materials, such as an oxide. For example, inorganic low k dielectric materials are readily damaged by techniques used to remove photoresist materials after the patterning of a layer. Hence, a feature formed in an inorganic low k dielectric layer may be damaged when the photoresist layer used to form the trench is removed. This is of special concern in a dual damascene arrangement if formed in a conventional manner since the inorganic material in the lower, via layer, will be damaged two times. In other words, the inorganic dielectric material in the via layer will be damaged a first time by the removal of photoresist used in forming the via. The same inorganic low k dielectric material in the via layer will also be damaged a second time when the upper layer, the trench layer, is patterned and the photoresist is removed.

An area of concern in the formation of trench and via interconnect structures by dual damascene technique is the possibility of misalignment of the via and the trench. As seen in the top view of FIG. 17, a via 70 that has been formed in a lower dielectric layer is misaligned with respect to the trench (and the subsequently formed conductive line 60). Hence, only a portion of the via 70 is filled with conductive material to form the conductive plug 62.

A side view of the structure of FIG. 17 is depicted in FIG. 16. The pattern 68 formed in the middle etch stop layer 65 over the first dielectric layer 64 is misaligned with respect to the trench pattern. When the trench in the second dielectric layer 66 and the via are etched in a simultaneous anisotropic etch, the etch will proceed in accordance with the overlying trench pattern. This causes only a portion of the intended via to be opened, since the via is not fully underneath the trench. Upon subsequent filling with conductive material, the conductive plug 62 that is formed is narrower than intended. This undesirably increases the resistance of the conductive plug 62, leading to increases in RC.

There is a need for a method and arrangement for providing an interconnect structure which allows an inorganic low k dielectric layer to be employed in a via layer without subjecting the via to two separate damaging process steps. There is also a need to assure that fall width of a via is provided directly underneath a conductive line formed in a trench so that the conductive plug in the via has its full intended width.

SUMMARY OF THE INVENTION

These and other needs are met by embodiments of the present invention which provide a method of forming an interconnect structure comprising the steps of depositing a first dielectric material over a conductive layer to form a first dielectric layer. The first dielectric material is an inorganic dielectric material. An etch stop layer is formed on the first dielectric layer. The etch stop layer and the first dielectric layer are etched to form a slot via in the first dielectric layer. The slot via extends with a slot length in a first direction within the first dielectric layer. A second dielectric material is then deposited in the slot via and over the etch stop layer to form a second dielectric layer over the refilled slot via and the etch stop layer. The second dielectric material is an organic low k dielectric material. The refilled slot via is etched simultaneously with the second dielectric layer so that a feature is formed that extends within the second dielectric layer in a second direction that is normal to the first direction. At least a portion of the slot via is etched. The feature in the second dielectric layer has a width in the second direction that is less than the slot length, with the entire width of the feature being over the slot via.

The provision in a first dielectric layer of a slot via that is wider than the width of the trench assures that the conductive plug that is formed will be as wide as the overlying conductive line. Also, by depositing a second dielectric material within the via, after the initial formation of the via, the second etching of a via is through newly deposited dielectric material. This has the advantage of reducing the amount of damage sustained in the via formed in the inorganic dielectric material in the first dielectric layer by a resist removal process. This has the effect of increasing structural integrity of the inorganic dielectric layer and the formation of the conductive plug in the first dielectric layer.

The earlier stated needs are met by another embodiment of the present invention which provides a method of forming an interconnect structure comprising forming a slot via in a first dielectric layer, the slot via having a width and a length extending in a first direction in the plane of the first dielectric layer. A second dielectric layer is deposited on the first dielectric layer and in the slot via to refill the via. The dielectric material in the first dielectric layer is inorganic dielectric material and in the second dielectric layer is an organic dielectric material. The second dielectric layer and the refilled via are simultaneously etched to form a trench in the second dielectric layer, and a via in the first dielectric layer. The trench has a width and a length extending in a second direction in the plane of the second dielectric layer. The first and second directions are substantially normal to one another. The width of the trench is less than the length of the slot via. The etched via has a width substantially equal to the width of the line and is substantially entirely under the line. The via and the trench are then filled with conductive material.

The earlier stated needs are also met by another embodiment of the present invention which provides an interconnect structure comprising a first dielectric layer comprising an inorganic dielectric material. The interconnect structure also has an etch stop layer with patterned slot extending in a first direction. A second dielectric layer is over the etch stop layer. The second dielectric layer comprises an organic dielectric material, with some of the organic dielectric material being in the first dielectric layer within a slot via region defined by the patterned slot. A conductive stud is provided within a via formed in the slot via region of the first dielectric layer. A conductive line is formed in the second dielectric layer and extends in a second direction normal to the first direction. The conductive line and the conductive stud have substantially the same width. Substantially the entire width of the conductive stud is located directly beneath the conductive line.

The foregoing and other features, aspects, and advantages of the present invention will become more apparent in the following detail description of the present invention when taken in conjunction with the accompanying drawings.

DETAILED DESCRIPTION OF THE INVENTION

The present invention addresses and solves problems associated with the use of low k dielectric materials in the dielectric layers of a self-aligned dual damascene arrangement in a metal interconnect region of a semiconductor chip. Specifically, the present invention lowers the overall dielectric constant value of the film and prevents extensive damage to the lower dielectric layer of the dual damascene arrangement. This is accomplished, in part, by providing an inorganic low k dielectric layer as the bottom dielectric layer in the dual damascene arrangement. A slot via is formed in the first dielectric layer that extends perpendicularly to the trench that will be formed in the second dielectric layer. The slot via is longer than the width of the trench. After forming the slot via, and removing the photoresist used to pattern this slot via, the slot via is re-filled with low k dielectric matter that is used to form the second low k dielectric layer. When the second dielectric layer is etched to form the trench or other feature in the second dielectric layer, the re-filled slot via is again etched to re-open the portion of the via directly underneath the trench. The slot via thus assures that the via that is eventually formed has a full width directly underneath the trench. Also, the re-opened via will only be exposed a single time to the damaging step of removing the photoresist, which will occur upon the removal of the photoresist employed to pattern the second dielectric layer.

Figure 1:
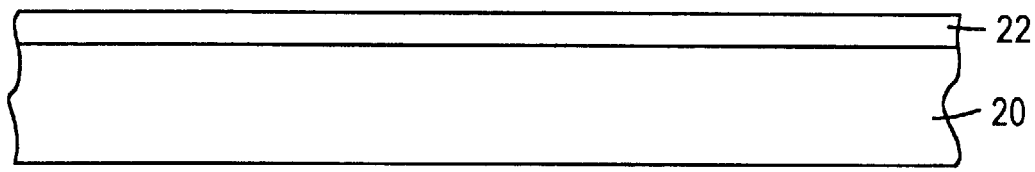
FIG. 1 is a cross-section of a metal interconnect portion of a semiconductor wafer after a first etch stop layer is deposited on an underlying conductive interconnection layer, in accordance with embodiments of the present invention.

FIG. 1 depicts a cross-section of a metal interconnect portion of a chip processed in accordance with embodiments of the present invention, at one stage of the processing. At this stage, a conductive layer 20 has been formed, which may be made of a metal, for example, or other conductive material. In especially preferred embodiments, the conductive metal is copper or a copper alloy, due to the earlier stated advantages of copper over other metals. A first etch stop layer 22 is formed, by deposition, for example, over the conductive layer 20. The first etch stop layer 22, in certain embodiments, is made of silicon nitride. Other materials may be used for the first etch stop layer 22, such as silicon oxynitride, silicon carbide, etc. A primary purpose of the first etch stop layer at 22 is to protect the conductive material 20 during etching of the overlying dielectric layers. Also, the first etch stop layer 22 acts as a diffusion barrier to prevent diffusion of copper or other conductive material into the surrounding dielectric material.

Figure 2:
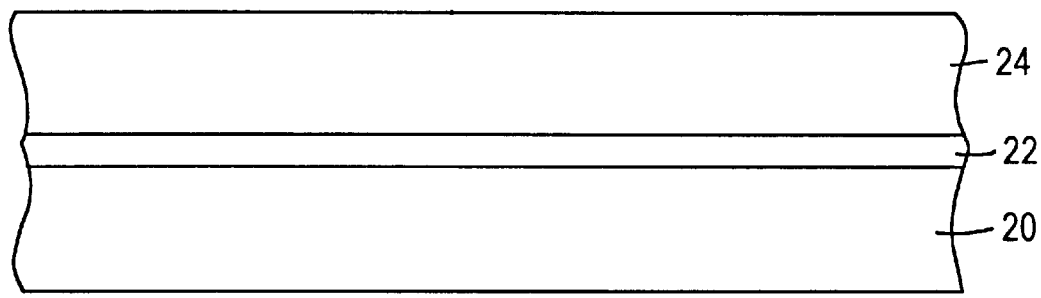
FIG. 2 is a cross-section of the metal interconnect portion of FIG. 1, after a first dielectric layer is formed on the first etch stop layer, in accordance with the embodiments of the present invention.

As shown in FIG. 2, a first dielectric layer 24 is then formed on the first etch stop layer 22. In the present invention, the material forming the first dielectric layer 24 is an inorganic dielectric material. In particularly preferred embodiments, the inorganic dielectric material is an inorganic low k dielectric material. An example of an inorganic dielectric material is a silicon oxide, such as $SiO_2$. Examples of inorganic low k dielectric materials include methyl silsesquioxane (MSQ), hydrogen silsesquioxane (HSQ), and fluorinated TEOS (FTEOS). For purposes of example, assume that the first dielectric layer 24 is formed to a thickness of between about 1,000 and about 8,000 Å.

Figure 3:
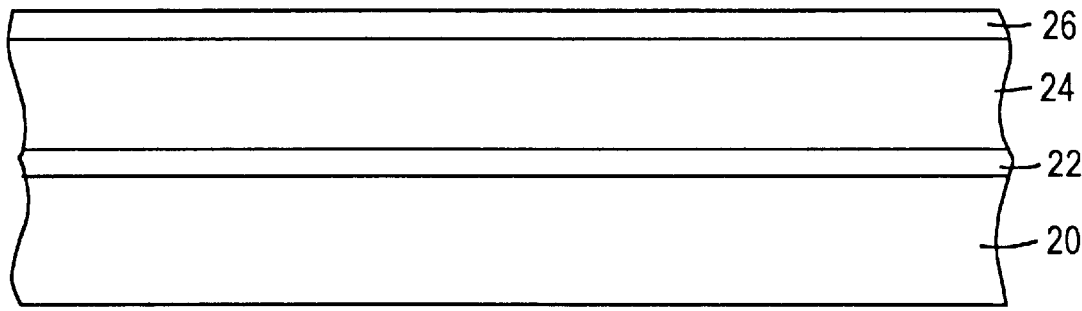
FIG. 3 is a cross-section of the metal interconnect portion of FIG. 2, following deposition of a second etch stop layer on the first dielectric layer, in accordance with the embodiments of the present invention.

A second, middle etch stop layer 26 is deposited on the first dielectric layer 24, as depicted in FIG. 3. The second etch stop layer 26 comprise a nitride, such as silicon nitride, or silicon oxynitride, for example. An advantage of silicon oxynitride over silicon nitride is its lower dielectric constant, and can also be used as an anti-reflective coating. Another example of a suitable etch stop layer is silicon carbide. Other materials suitable for serving as an etch stop layer may also be used instead of the above examples. The first dielectric layer 24 is partially protected by the second etch stop layer 26 during the etching of the second dielectric layer when the trench is later formed in that layer.

Figure 4:
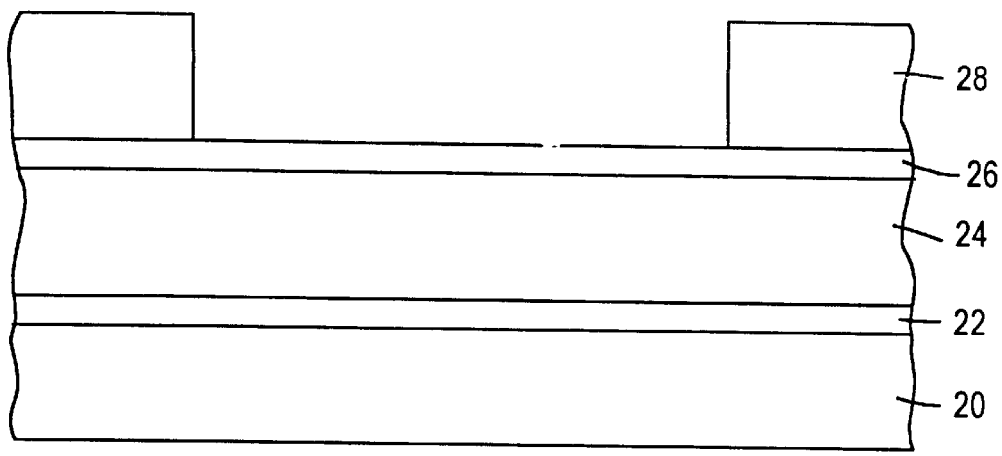
FIG. 4 is a cross-section of the portion of FIG. 3, following the deposition and patterning of a photoresist layer on the second etch stop layer to define the slot via to be etched into the first dielectric layer, in accordance with the embodiments of the present invention.

FIG. 4 is a cross-section of the metal interconnect portion of FIG. 3 following the deposition and patterning of a photoresist layer 28 on the second etch stop layer 26. The pattern created within the photoresist layer 28 defines the feature, such as a slot via, that will eventually be etched into the first dielectric layer 24.

Figure 15:
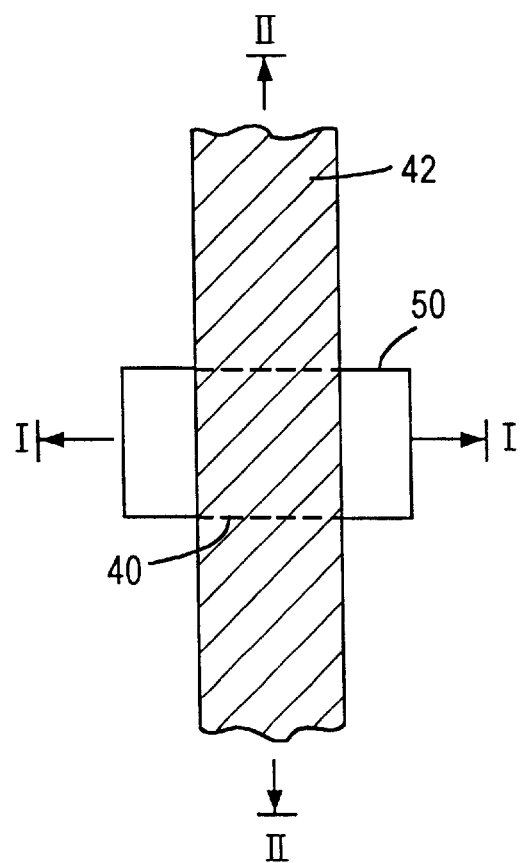
FIG. 15 is a top view of a portion of an interconnect arrangement having a slot via in accordance with the embodiments of the present invention.
Figure 16:
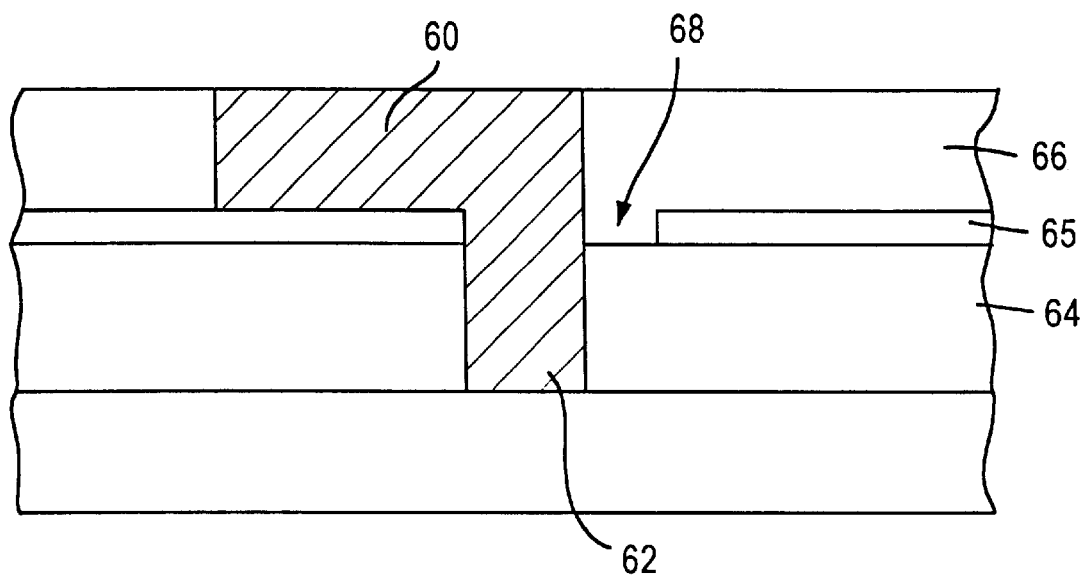
FIG. 16 is a cross-section of a portion of an interconnect arrangement formed in accordance with the prior art.
Figure 17:
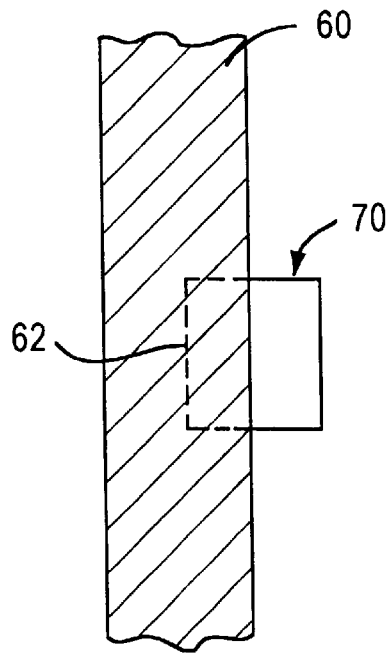
FIG. 17 is a top of a portion of an interconnect arrangement formed in accordance with the prior art.

Unlike conventional vias, the slot via of the present invention has a length that is greater than the width of the trench that will be formed in the second dielectric layer. In order to assure that the slot will extend across the entire width of the trench, the length of the slot via in certain embodiments of the invention is made equal to the width of the trench plus two times the misalignment tolerance. For example, assuming that the misalignment tolerance is 8 nm, a perfectly aligned slot via will extend 8 nm on both sides of the trench, as shown in FIG. 15. On the other hand, a maximally misaligned slot via will extend 16 nm from one side of the trench, but the other end of the slot via will coincide with the other side of the trench. This assures that a via will be formed that extends completely under the entire width of the trench. The slot via will be perpendicular to the trench that will be formed, as depicted in FIG. 15. Since each slot via could possibly extend by a maximum tolerance on one side of a trench, the trench lines should be separated by more than twice the maximum tolerance to prevent two maximally misaligned vias connected to adjacent lines from contacting each other.

Figure 5:
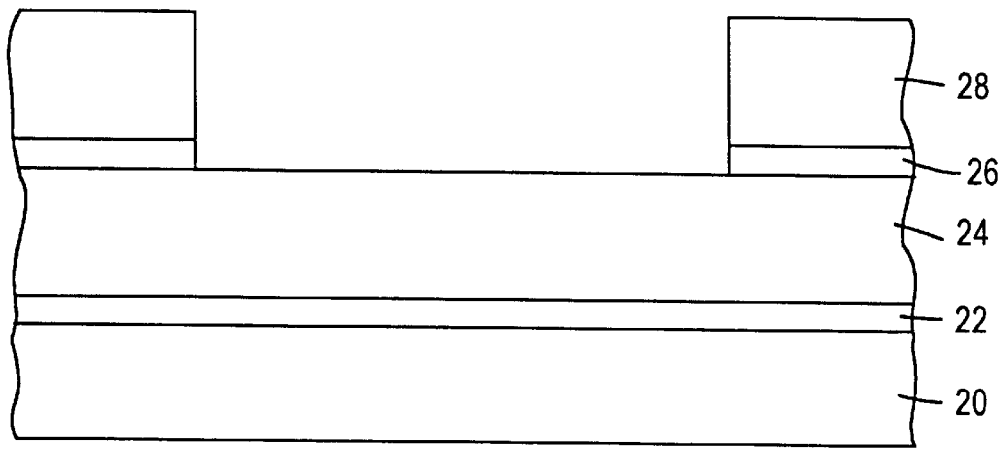
FIG. 5 is a cross-section of the portion of FIG. 4, after the second etch stop layer is etched in accordance with the pattern in the photoresist layer, in accordance with the embodiments of the present invention.

FIG. 5 depicts the cross-section of FIG. 4 after the second etch stop layer 26 has been etched in accordance with the pattern in the photoresist layer 28. When the second etch stop layer 26 is silicon oxynitride, for example, the second etch stop layer 26 is etched with an etchant chemistry that is selective to silicon oxynitride so that the underlying first dielectric layer 24 is not substantially etched. An exemplary suitable etchant chemistry is $CHF_3/N_2$.

Figure 6:
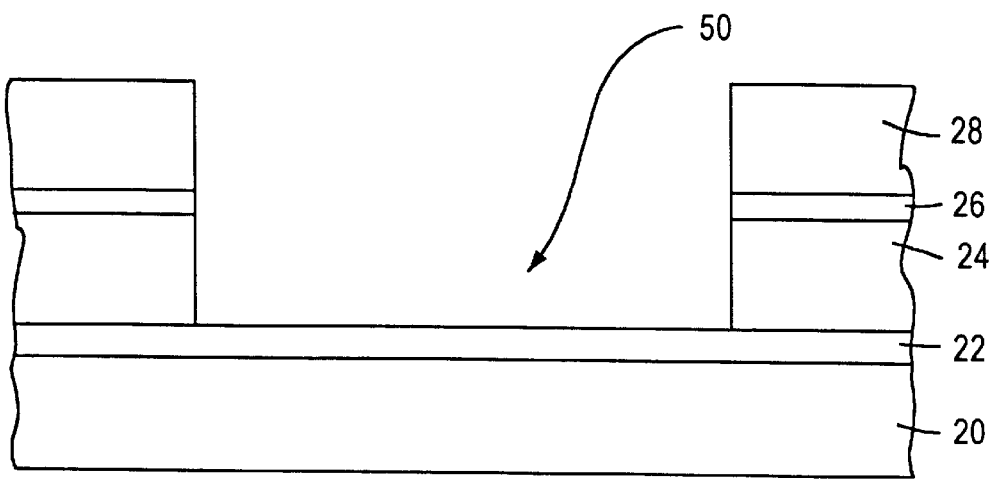
FIG. 6 is a cross-section of the portion of FIG. 5, after the first dielectric layer has been etched in accordance with the pattern that has been etched in the second etch stop layer, in accordance with the embodiments of the present invention.

FIG. 6 is a cross-section of the portion of FIG. 5 following the etching of the first dielectric layer 24 in accordance with the embodiments of the present invention to form a slot via 50. An exemplary etchant includes $CHF_3/O_2/Ar$, $CF_4$, or $C_2F_6$. These etchants are exemplary only, as a suitable etchant may be employed depending on the particular inorganic dielectric material comprising the first dielectric layer. The etchant should be selective such that the material on the first dielectric layer 24 is etched, with the etching stopping at the first etch stop layer 22.

Figure 7:
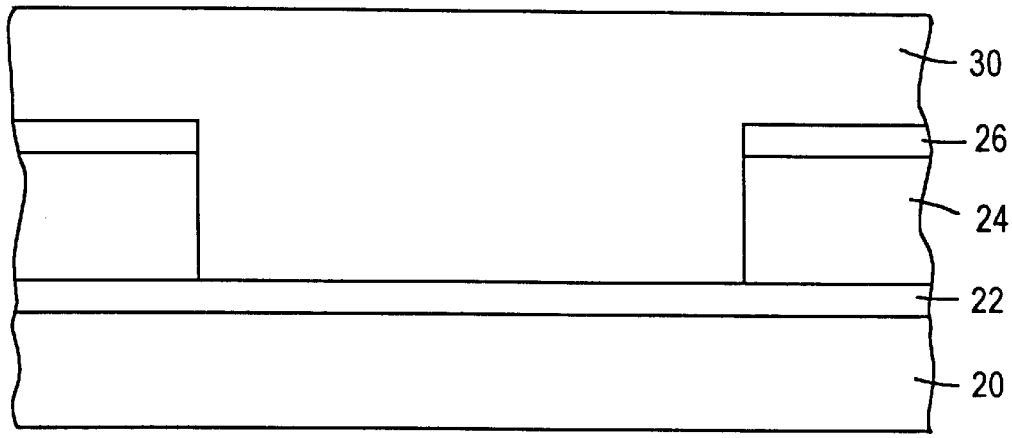
FIG. 7 is a cross-section of the portion of FIG. 6, following the removal of the photoresist layer and the formation of a second dielectric layer on the second etch stop layer and the filling of the slot via in the first dielectric layer, in accordance with the embodiments of the present invention.

FIG. 7 is a cross-section of the portion of FIG. 6 following the removal of the photoresist layer 28 and the formation of a second dielectric layer 30 over the second etch stop layer 26. The dielectric material in the second dielectric layer 30 also fills the slot via 50 that was previously opened in the first dielectric layer 24, as was depicted in FIG. 6. This has the result that the previously opened slot via 50, which may have been damaged by the removal of the photoresist layer 28, has been refilled with dielectric material that has not been damaged. Two of the four sides of the re-filled slot via 50 will not be damaged, while the two remaining sides will remain somewhat damaged by the photoresist removal process.

The dielectric material in the second dielectric layer 30 and in the now re-filled slot via 50 in the first dielectric layer 24 is an organic dielectric material in the embodiments of the present invention. In preferred embodiments of the invention, the organic dielectric material is a low k dielectric material. The organic low k dielectric material may be selected from a number of different materials, including SILK, benzocyclobutene, Nautilus (all manufactured by Dow), polyfluorotetraethylene (manufactured by DuPont), FLARE (manufactured by Allied Chemical), etc. The use of a low k dielectric material in the upper, trench layer is advantageous in that reduction of line-to-line capacitance is even more critical than reducing capacitance in the via layer to increase circuit operating speeds. It is preferred for the material in the second dielectric layer 30 to have good gap filling qualities, so that the slot via 50 will be completely filled. Those of ordinary skill in the art may readily select such a material taking into account this consideration.

The slot via 50 is re-filled with the same material as in the upper, second dielectric layer 30. It should be appreciated that the use of the same dielectric material in the second dielectric layer 30 and in the re-filled slot via 50 in the first dielectric layer 24 ensures that a single etchant can be employed to etch both the trench and the re-filled slot via 50.

Figure 8:
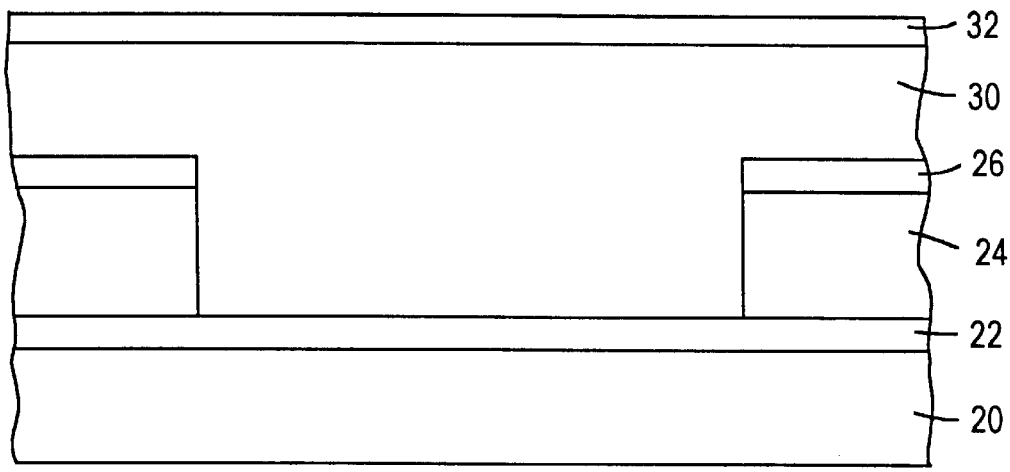
FIG. 8 is a cross-section of the portion of FIG. 7, following the deposition of a hard mask layer on the second dielectric layer, in accordance with the embodiments of the present invention.

In certain embodiments, planarization is not required due to the spin-on nature of the second dielectric layer 30. In other embodiments, planarization of the second dielectric layer 30 is performed, such as by CMP. In either embodiment, a hard mask layer 32 is deposited on the second dielectric layer 30, as depicted in FIG. 8. The hard mask layer 32 may comprise silicon nitride or silicon oxide, for example, and serves to selectively protect the second dielectric layer 30 during the etching steps.

Figure 9:
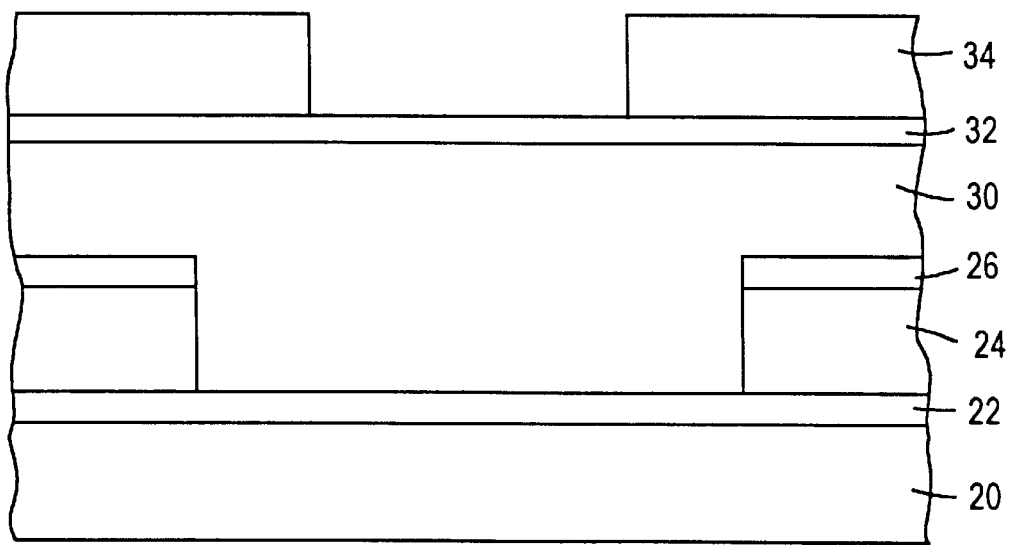
FIG. 9 is a cross-section of the portion of FIG. 8, following the positioning and patterning of a photoresist layer on a second dielectric layer to define a first feature to be etched in the second dielectric layer, in accordance with the embodiments of the present invention.

As shown in FIG. 9, a photoresist layer 34 is then deposited and patterned on the hard mask layer 32. The pattern in the photoresist layer 34 contains a feature that is to be etched into the second dielectric layer 30. The desired feature, such as a trench opening, is created (see FIG. 10) by etching the hard mask layer 32 and the second dielectric layer 30. The etching continues through the portion of the re-filled slot via 50 that is directly under the trench formed in the second dielectric layer 30. The etching stops at the first etch stop layer 22. As can best be appreciated in FIG. 10, only a portion of the slot via 50 is etched in this step, with the remaining portion of the slot via 50, i.e., that portion not directly under the trench, still containing the second dielectric material. In preferred embodiments of the invention, multiple etching steps are used to create the structure depicted in FIG. 10. These steps include etching the hard mask layer 32, followed by simultaneously etching the second dielectric layer 30 and the re-filled slot via 50 in the first dielectric layer 24.

A suitable etchant chemistry for etching the nitride hard mask layer 32 is $CHF_3/N_2$. The etchant chemistry employed to etch the organic dielectric material in the second dielectric layer 30 and the re-filled via may be $N_2/H_2$, or $O_2/N_2/Ar$, for example.

Figure 11:
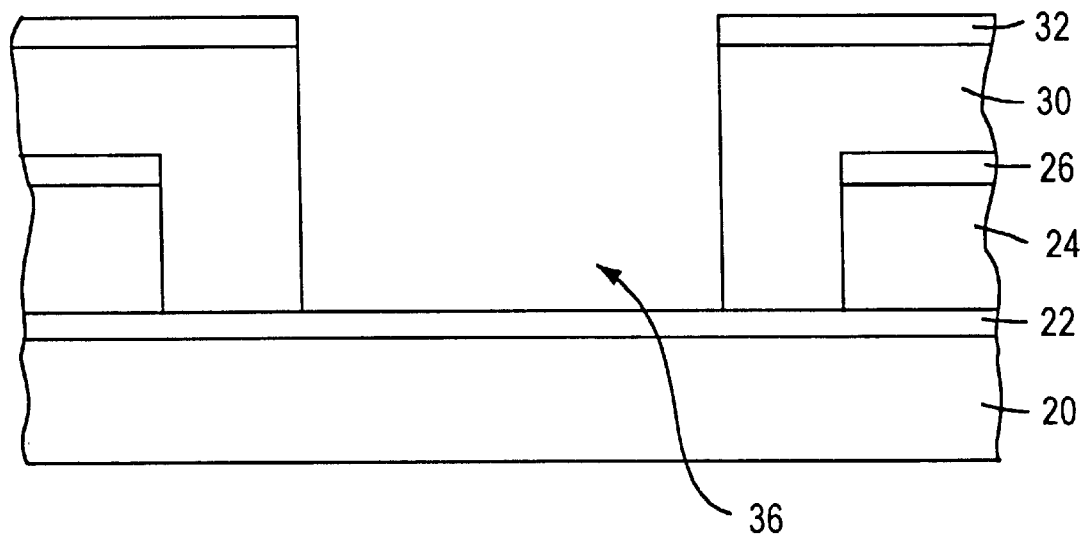
FIG. 11 is a cross-section of the portion of FIG. 10, following removal of the photoresist layer, in accordance with the embodiments of the present invention.

As seen in FIG. 11, the photoresist layer 34 may be removed by an etching or oxygen ashing process. Since the second dielectric layer 30 and the re-opened via 36 are formed from organic dielectric material, the photoresist removal process causes little or no damage to either the trench or the via that have been formed. This provides an improvement in the structure of the via 36 over processes in which the inorganic dielectric material in the via layer is subjected to multiple process steps in which the feature may be damaged.

Figure 12:
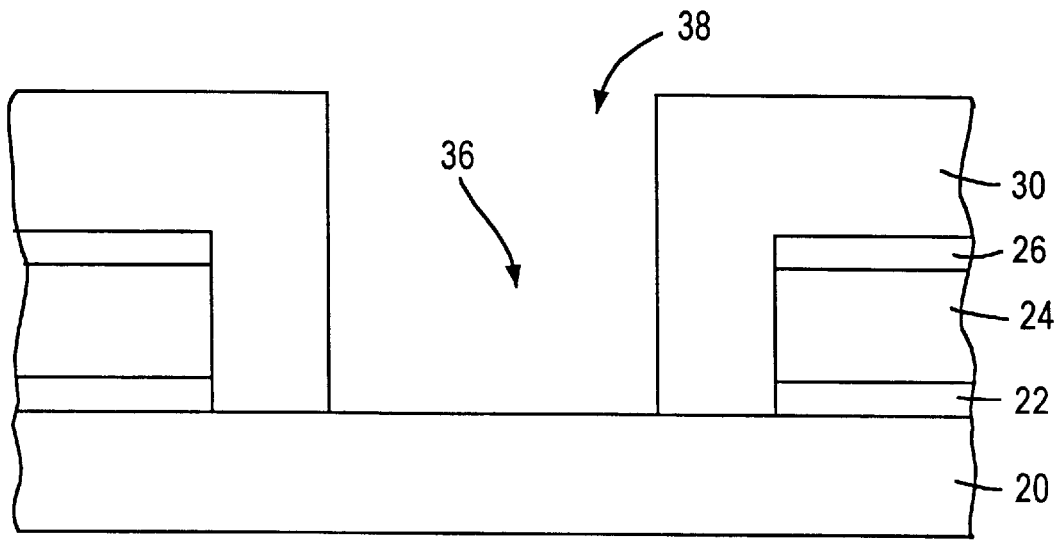
FIG. 12 is a cross-section of the portion of FIG. 11, following etching of the first etch stop layer, in accordance with the embodiments of the present invention.

The first etch stop layer 22 is now etched within the re-opened via 36 that now exists in the first dielectric layer 24, as seen in FIG. 12. This removes the etch stop material covering the conductive material on the conductive layer 20. A suitable etchant to remove the etch stop material, for example silicon nitride, while not adversely affecting the conductive material (e.g., copper), is $CHF_3/N_2$. This etchant chemistry prevents copper oxidation, removes sidewall polymer with $N_2$, and etches the nitride without undercutting the dielectric material in the second dielectric layer 30 or the dielectric material in the first dielectric layer 24. The etching of the first etch stop layer 22 leaves a first opening 36, such as a via hole, and a second opening 38, such as a trench.

Figure 10:
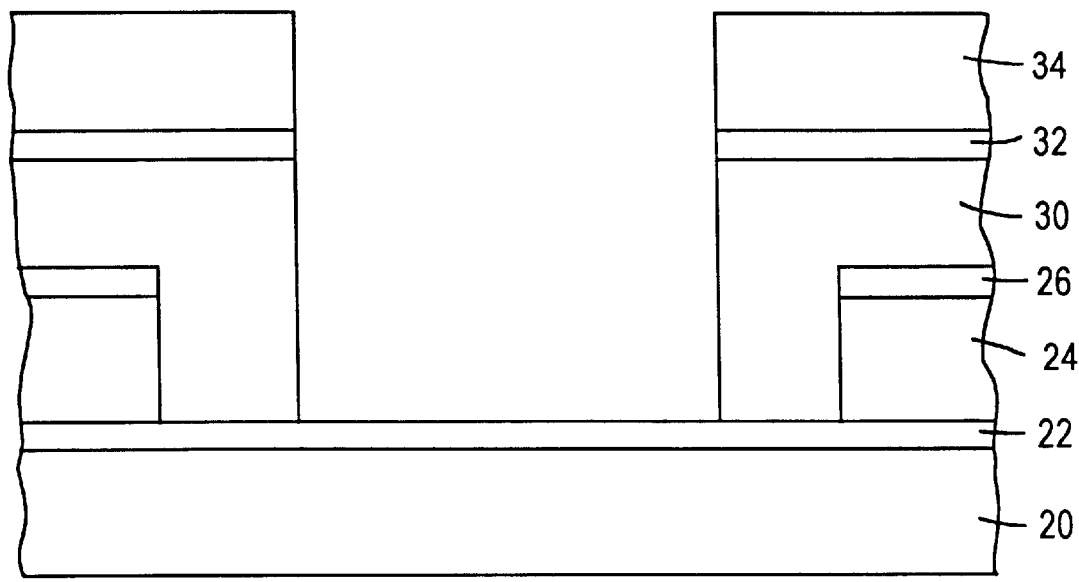
FIG. 10 is a cross-section of the portion of FIG. 9, after etching through the hard mask layer and the second dielectric layer in accordance with the pattern in the photoresist layer to create a first feature in the second dielectric layer, and etching through the second etch stop layer and the filled slot via to define a via in the first dielectric layer, in accordance with the embodiments of the present invention.

Although FIGS. 10, 11 and 12 have been shown separately, these steps are performed in situ, in certain embodiments of the invention. For example, the etching and the photoresist removal in FIGS. 10 and 11 may be performed in a single step, followed by etching of the first etch stop layer 22 without removal of the wafer from the etching chamber.

Figure 13:
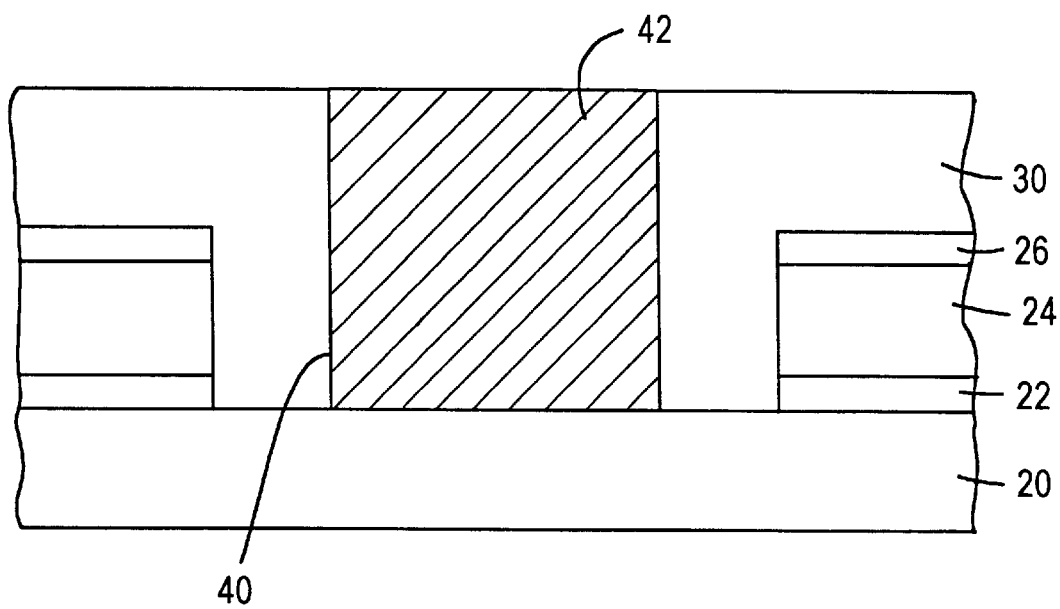
FIG. 13 is a cross-section of the portion of FIG. 12, taken along line I—I of FIG. 15, after the first and second features are filled with a conductive material, in accordance with the embodiments of the present invention.
Figure 14:
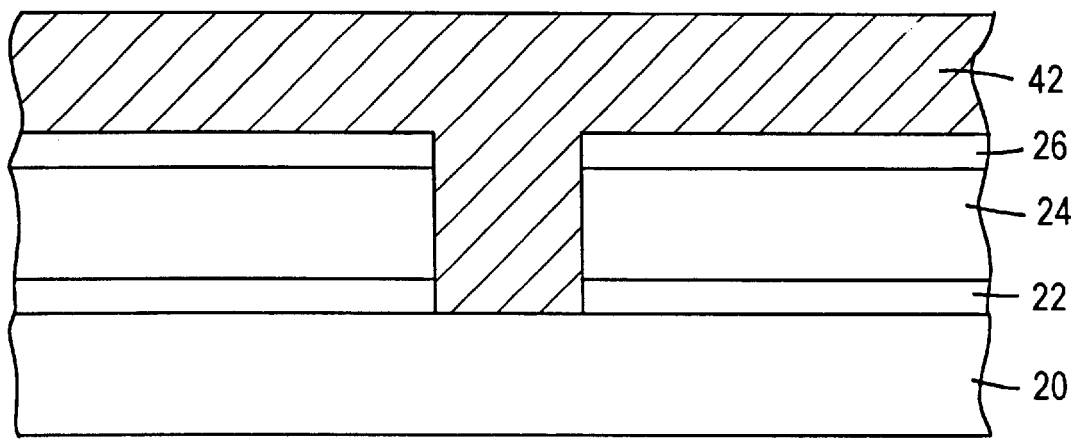
FIG. 14 is a cross-section of the portion of FIG. 12, taken along line II—II of FIG. 15, after the first and second features are filled with a conductive material, in accordance with the embodiments of the present invention.

The via hole 36 and the trench 38 are now filled in a simultaneous deposition step with conductive material, preferably copper in certain embodiments of the present invention. Deposition of a barrier layer, typically employed to prevent copper diffusion, is not depicted in order not to obscure the invention, although one can be provided. Also, in certain embodiments of the invention, barrier layers not needed as certain low k dielectric materials form a self-barrier against copper diffusion. After chemical mechanical planarization (CMP), the dual damascene structure of FIG. 13 is formed with the via (or stud) 40 electrically connecting the underlying conductive layer 20 to the conductive line 42 formed in the trench 38.

The filling of a previously formed slot via during the deposition of a second dielectric layer allows the formation of a via that is subjected to only one damaging process, instead of multiple damaging processes, such as photoresist removals. This enhances the integrity of the features formed in the lower dielectric layer, such as a via layer, while allowing the use of inorganic low k dielectric materials in both layers of a dual damascene arrangement. The use of a slot via ensures that the via which is ultimately formed will extend completely underneath the trench. Furthermore, the use of organic dielectric material in the trench layer provides a trench layer that is relatively free of significant plasma ashing or wet clean damage, which provides a significant improvement in the quality of the trench layer.

Although the present invention has been described and illustrated in detailed, it is to be clearly understood that the same is by way of illustration and example only and is not to be taken by way of limitation, the scope of the present invention being limited only by the terms of the appended claims.

What is claimed is:

1. A method of forming an interconnect structure, comprising the steps of:
   depositing a first dielectric material over a conductive layer to form a first dielectric layer, the first dielectric material being an inorganic dielectric material;
   forming an etch stop layer on the first dielectric layer;
   etching the etch stop layer and the first dielectric layer to form a slot via in the first dielectric layer, the slot via extending with a slot length in a first direction within the first dielectric layer;
   depositing a second dielectric material in the slot via and over the etch stop layer to form a second dielectric layer over the slot via and the etch stop layer, the second dielectric material being an organic low k dielectric material; and
   simultaneously etching the slot via and the second dielectric layer such that a feature is formed that extends within the second dielectric layer in a second direction that is normal to the first direction, and at least a portion of the slot via is etched, the feature having a width in the second direction that is less than the slot length, with the entire width of the feature being over the slot via.

2. The method of claim 1, wherein the organic low k dielectric material is selected from at least one of Silk, benzocyclobutene, FLARE, Nautilus, and Teflon.

3. The method of claim 2, wherein the inorganic dielectric material is selected from at least one of silicon dioxide, methyl silsesquioxane (MSQ), hydrogen silsesquioxane (HSQ), and fluorine tetraethylorthosilicate (FTEOS).

4. The method of claim 3, wherein the step of etching the etch stop layer and the first dielectric layer includes etching with $C_4F_8/Ar/CO$ or $CHF_3/CO/Ar$.

5. The method of claim 4, wherein the step of simultaneously etching the slot via and the etch stop layer includes etching with at least one of $N_2/H_2$ and $O_2/N_2/Ar$.

6. The method of claim 5, further comprising depositing conductive material simultaneously in the slot via and the feature.

7. The method of claim 6, wherein the conductive material is copper.

8. The method of claim 2, wherein the step of simultaneously etching the slot via and the etch stop layer includes etching with at least one of $N_2/H_2$ and $O_2/N_2/Ar$.

9. The method of claim 1, wherein the inorganic dielectric material is selected from at least one of silicon dioxide, methyl silsesquioxane (MSQ), hydrogen silsesquioxane (HSQ), and fluorine tetraethylorthosilicate (FTEOS).

10. A method of forming an interconnect structure comprising:
    forming a slot via in a first dielectric layer, the slot via having a width and a length extending in a first direction in the plane of the first dielectric layer, dielectric material in the first dielectric layer being an inorganic dielectric material;
    depositing a second dielectric layer on the first dielectric layer and in the slot via, wherein dielectric material in the second dielectric layer is organic dielectric material;
    simultaneously etching in the second dielectric layer and in the slot via to form a trench having a width and a length extending in a second direction in the plane of the second dielectric layer, and a via in the first dielectric layer, wherein: the first and second directions are substantially normal to one another, the width of the trench is less than the length of the slot via, and the etched via has a width substantially equal to the width of the line and is substantially entirely under the line; and
    filling the via and the trench with conductive material.

11. The method of claim 10, wherein the organic dielectric material is selected from at least one of SILK, benzocyclobutene, FLARE, Nautilus, and Teflon.

12. The method of claim 11, wherein the inorganic dielectric material is selected from at least one of silicon dioxide, methyl silsesquioxane (MSQ), hydrogen silsesquioxane (HSQ), and fluorine tetraethylorthosilicate (FTEOS).

13. The method of claim 12, wherein the step of forming a slot via includes etching the inorganic dielectric material with $C_4F_8/Ar/CO$ or $CHF_3/CO/Ar$.

14. The method of claim 13, wherein the step of simultaneously etching in the second dielectric layer and in the slot via includes etching with at least one of $N_2/H_2$ and $O_2/N_2/Ar$.

15. The method of claim 14, wherein the conductive material is copper.

* * * * *